United States Patent [19]
Wojnarowski

[11] Patent Number: 6,002,163
[45] Date of Patent: Dec. 14, 1999

[54] ELECTRONIC DEVICE PAD RELOCATION, PRECISION PLACEMENT, AND PACKAGING IN ARRAYS

[75] Inventor: Robert John Wojnarowski, Ballston Lake, N.Y.

[73] Assignee: General Electric Company, Schenectady, N.Y.

[21] Appl. No.: 09/217,334

[22] Filed: Dec. 21, 1998

Related U.S. Application Data

[62] Division of application No. 09/002,314, Jan. 2, 1998, Pat. No. 5,888,884.

[51] Int. Cl.$^6$ .................................................. H01L 23/31
[52] U.S. Cl. ...................... 257/620; 257/618; 257/621; 257/622; 257/777; 257/778
[58] Field of Search ........................... 257/774, 777, 257/778, 688, 689, 618, 620, 619, 621, 622, 623; 438/113, 462, 460, 463, 464, 666, 667; 29/759, 830

[56] References Cited

U.S. PATENT DOCUMENTS

| | | |
|---|---|---|
| 4,783,695 | 11/1988 | Eichelberger et al. . |
| 4,835,704 | 5/1989 | Eichelberger et al. . |
| 4,836,435 | 6/1989 | Napp et al. . |
| 4,878,991 | 11/1989 | Eichelberger et al. . |
| 4,897,153 | 1/1990 | Cole et al. . |
| 4,930,216 | 6/1990 | Nelson . |
| 4,933,042 | 6/1990 | Eichelberger et al. . |
| 4,984,358 | 1/1991 | Nelson ...................................... 29/830 |
| 5,094,709 | 3/1992 | Eichelberger et al. . |
| 5,118,027 | 6/1992 | Braun et al. . |
| 5,161,093 | 11/1992 | Gorczyca et al. . |
| 5,200,810 | 4/1993 | Wojnarowski et al. . |
| 5,237,434 | 8/1993 | Feldman et al. ........................... 359/19 |
| 5,239,191 | 8/1993 | Sakumoto et al. . |
| 5,324,687 | 6/1994 | Wojnarowski ........................... 437/225 |
| 5,352,629 | 10/1994 | Paik et al. . |
| 5,353,195 | 10/1994 | Fillion et al. . |
| 5,353,498 | 10/1994 | Fillion et al. . |
| 5,366,906 | 11/1994 | Wojnarowski et al. . |
| 5,455,459 | 10/1995 | Fillion et al. . |
| 5,492,586 | 2/1996 | Gorczyca . |
| 5,497,033 | 3/1996 | Fillion et al. . |
| 5,546,654 | 8/1996 | Wojnarowski et al. . |
| 5,684,677 | 11/1997 | Uchida et al. ........................... 361/770 |
| 5,703,400 | 12/1997 | Wojnarowski et al. . |
| 5,818,404 | 10/1998 | Lebby et al. .............................. 345/82 |

*Primary Examiner*—Tom Thomas
*Assistant Examiner*—Luan Thai
*Attorney, Agent, or Firm*—Ann M. Agosti; Jill M. Breedlove

[57] ABSTRACT

Top die pads are electrically relocated by forming holes through a semiconductor wafer between device active regions. An electrically insulating layer is formed over all exposed surfaces of the wafer, including within the holes, and openings are made in the insulating layer for access to the top interconnection pads. The wafer and holes are metallized and patterned to form bottom interconnection pads electrically connected to corresponding top interconnection pads by metallization extending within the holes. A dicing saw having a kerf width less than the diameter of the holes is employed to separate the individual devices. For accurate position alignment of repatterned die, an alignment structure, such as projecting pins or an egg crate structure, engages the die, and alignment pads can be patterned on the die.

10 Claims, 13 Drawing Sheets

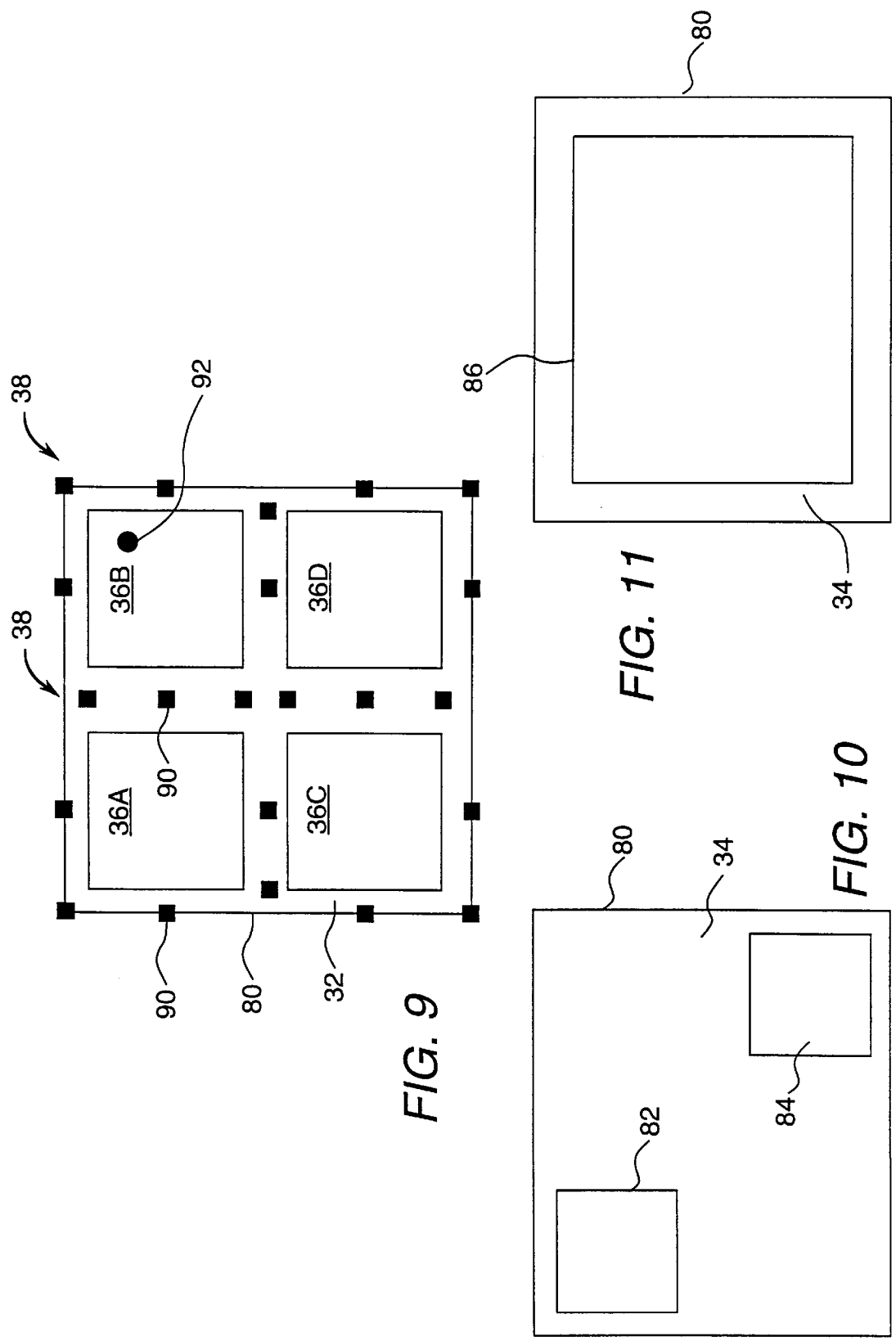

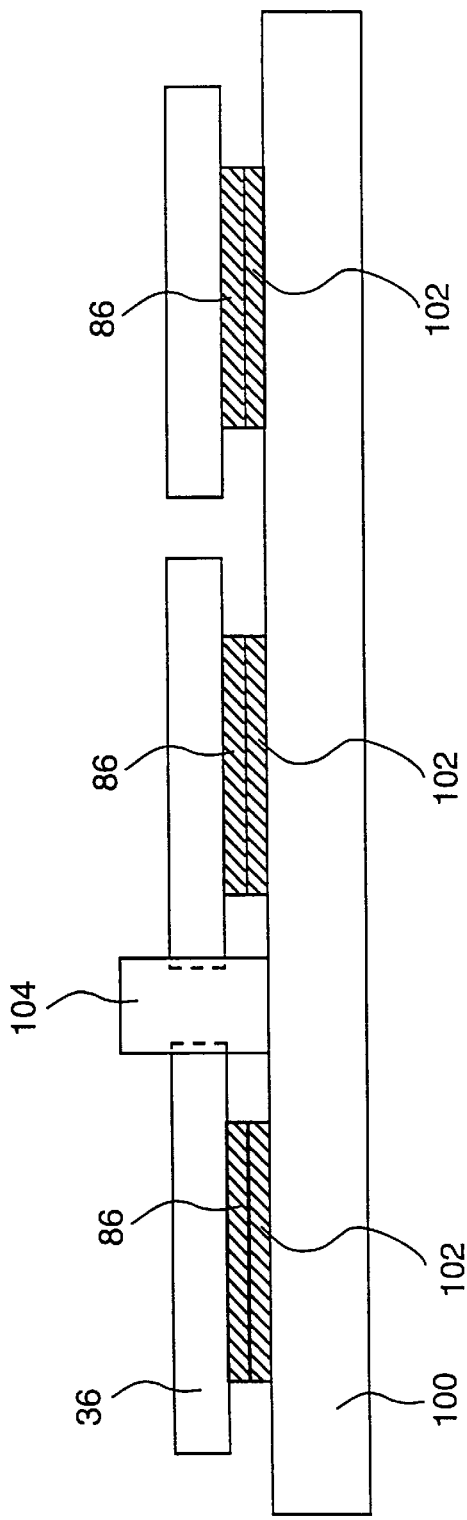
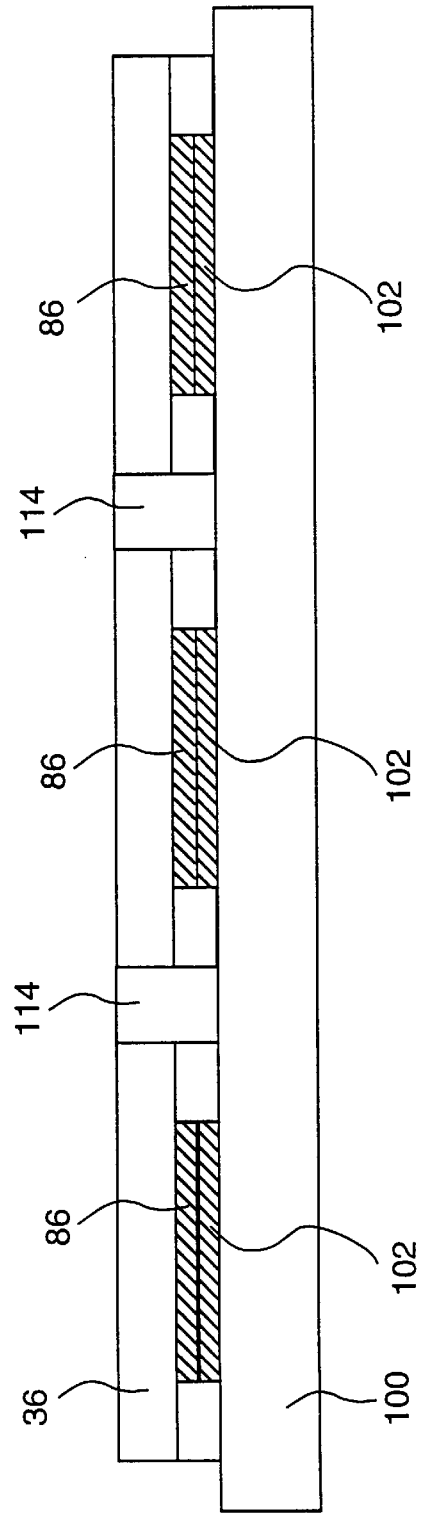
FIG. 12
FIG. 13

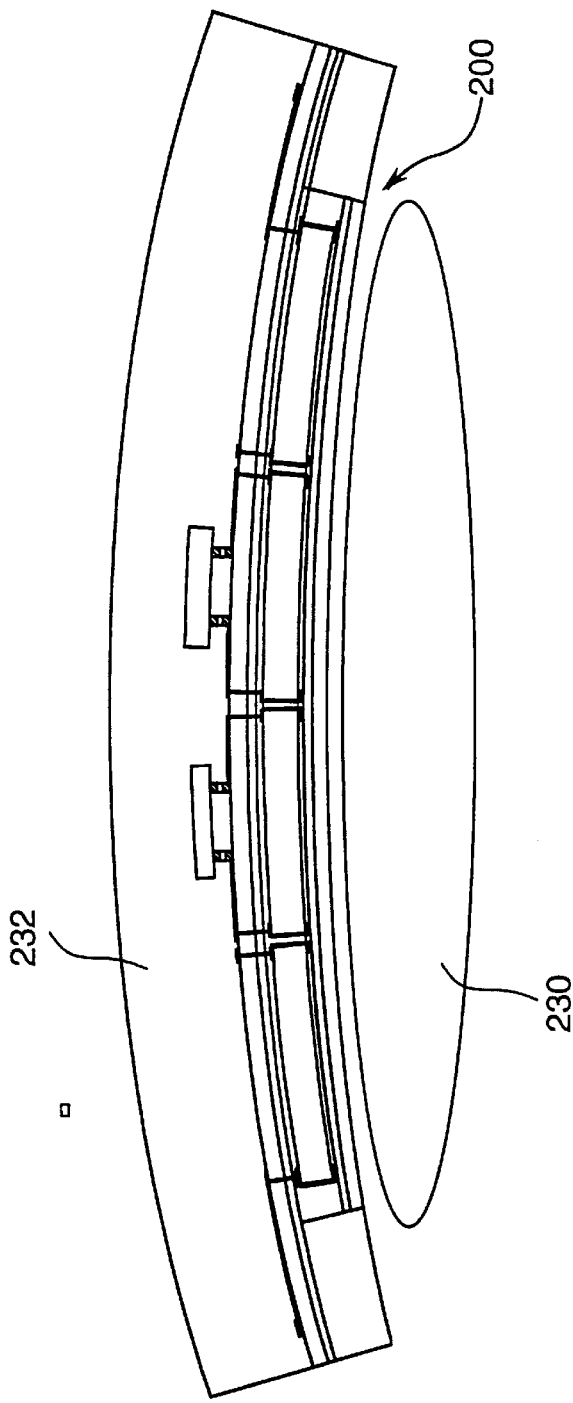
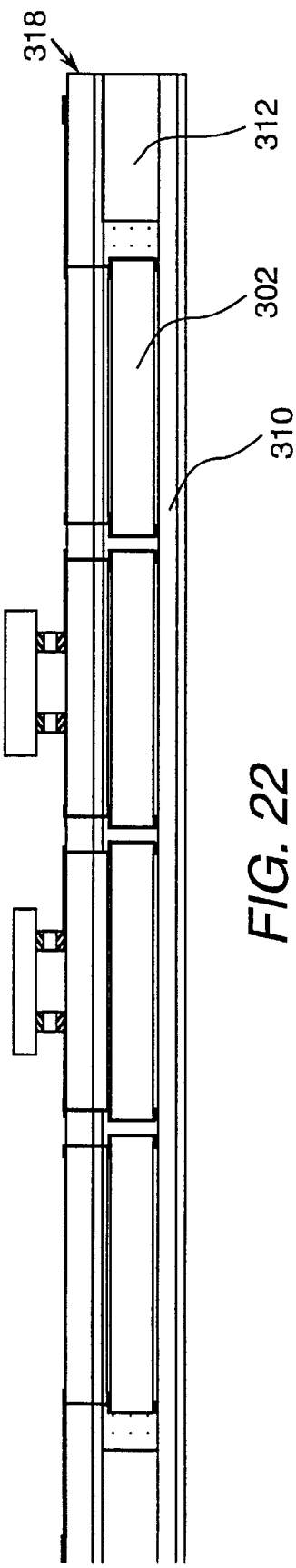
FIG. 19
FIG. 22

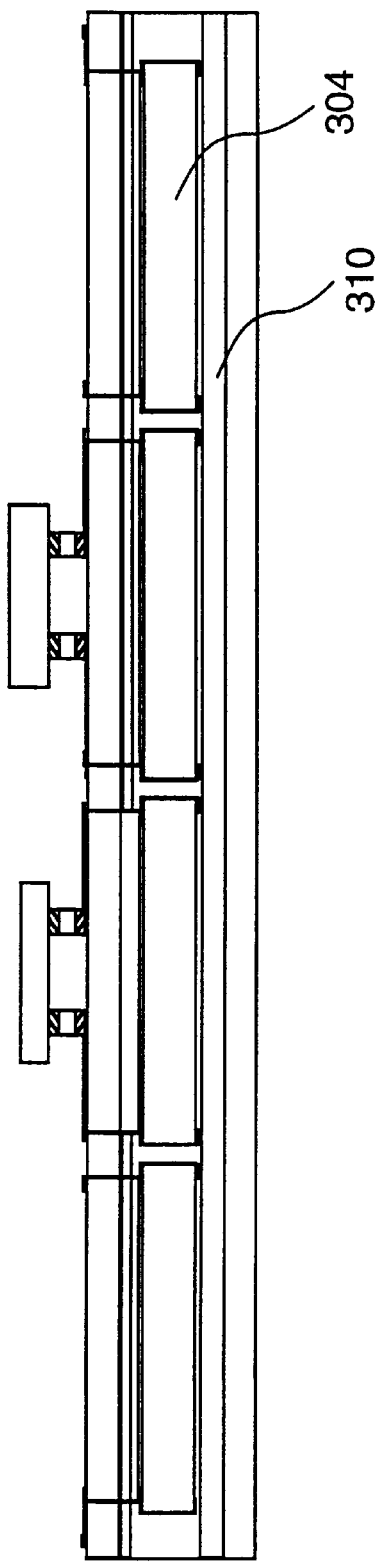
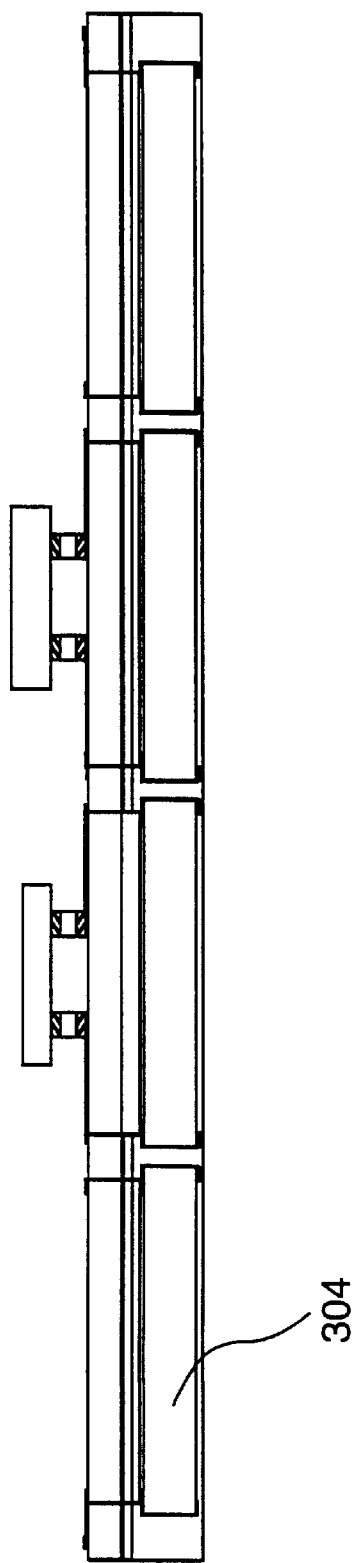
FIG. 23
FIG. 24

ELECTRONIC DEVICE PAD RELOCATION, PRECISION PLACEMENT, AND PACKAGING IN ARRAYS

This application is a division of application Ser. No. 09/002,314, filed Jan. 02, 1998, now U.S. Pat. No. 5,388,884 which is hereby incorporated by reference in its entirety.

BACKGROUND OF THE INVENTION

This invention relates generally to the assembly, interconnection and packaging of electronic devices. The invention more particularly relates to the electrical relocation of device top pads to the bottom of a device, as well as to the placement of devices, particularly arrays of devices, in precise locations. The invention is particularly useful in the fabrication of arrays of devices, such as imaging (viewing) or display devices, which are closely adjacent to each other and which must have precise alignment.

Many array structures such as solid state television image sensor arrays, infrared sensor arrays, x-ray imaging arrays, 3D holography and other display arrays, as well as other microelectronic and micromechanical devices, such as micro mirrors, require precision placement of individual devices or die to create an image free of artifacts which can be induced by component misalignment. Many of these devices require, in addition to accurate placement in an X-Y axis plane, accurate placement with reference to a Z directional axis, particularly in a focal plane array. Moreover, many die need to be less than 4 mils (0.004 inch) apart to avoid blank rows between the die which create voids in the generated image similar to netting projected onto a screen.

Related to the subject invention is a technology known as High Density Interconnect (HDI). Very briefly, and as disclosed in Eichelberger et al. U.S. Pat. No. 4,783,695, for example, an HDI structure employs a substrate on which various die and other components are placed and adhered in approximate desired locations, usually within a cavity. A multi-layer interconnect overcoat structure is then built up to electrically interconnect the components into an actual functioning system. As disclosed in aforementioned U.S. Pat. No. 4,783,695, the top surface is not necessarily planar, since the die cavities and die thicknesses vary, which causes a topology issue, particularly where components are mounted on top as disclosed in Wojnarowski et al. U.S. Pat. No. 5,200,810.

To begin the HDI overcoat structure, a polyimide dielectric film is laminated across the top of the die and other devices. The actual as-placed locations of the various components and contact pads thereon are determined, and via holes are adaptively laser drilled through the polyimide dielectric film in alignment with the contact pads on the electronic components. Thus, any misalignment of the individual electronic components and their contact pads on a surface, and in particular a variable surface (including a PCB (printed circuit board) as well as an HDI structure), is compensated for by an adaptive laser lithography system as disclosed in Eichelberger et al. U.S. Pat. No. 4,835,704. It may be noted that the adaptive lithography process accommodates initially poorly-placed die, but does not actually place or fix an initially poorly-placed die in a correct X-Y-Z axis position. The positions of the electrical connection pads are externally compensated for to allow die functionality.

Further details of the HDI embedded chip process are disclosed in Eichelberger et al. U.S. Pat. Nos. 4,933,042 and 5,094,709; Fillion et al. U.S. Pat. Nos. 5,353,498 and 5,497,033; and Wojnarowski et al. U.S. Pat. No. 5,546,654, for example.

The HDI process leads to an approximation of Wafer Scale Integration (WSI). Thus, die are placed in close proximity to each other to create a tile-like structure, and are interconnected to form an HDI module. Conventional HDI design rules and strategy require a minimum spacing between die, at least for adaptive lithography purposes, as well as for interconnection purposes in general, especially in the case of display or imaging (viewing) die where interconnections cannot cross the active area on top of the die and accordingly are limited to die edge regions and spaces between the die. This limits the maximum tile density that can be achieved.

State of the art solid state display applications, such as those that are desired to be used in 3D holography, as well as certain imaging (viewing) applications, include a die-to-die spacing of display or viewing die of less than 4 mils (0.004 inch), closer than the conventional HDI design rules allow, and which also leaves no room for die I/O and power connections. When conventional HDI technology is employed, a visible mesh grid is formed on a display screen, due to the relatively large spaces between die.

Additionally, conventional HDI technology employs an overlay technology that blocks a video sensor due to the filtering effect of the polymer overlay and adhesive. Removal of the overlay would include extensive large area ablation to selectively remove all of the polymer overlay material from the active areas. Some of these die, such as die made of InSb, HgCdTe and GaAs, are very sensitive to high temperatures and top surface damage which can result from laser ablation. When die are damaged due to large area ablation, the entire HDI overcoat structure must be removed to fix the damaged die. Additionally, many IR sensor die are very temperature-sensitive and cannot be subjected to processing temperatures greater than 100° C. The need to avoid blocking the active area of a video sensor die also greatly limits the area available for interconnect wiring to top die connection pads.

The HDI process in general produces structures that are not flat on top due to die cavity and die thickness variations, resulting in height variations of at least ±0.5 mil to ±1.0 mil. However, disclosed in aforementioned U.S. Pat. Nos. 5,353,498 and 5,497,033 is a method which provides a flat surface across the tops of several die. The die top surfaces are placed flat against a polymer stretched film (which may be removable), and then a polymeric molding material is employed to encapsulate all die surfaces except the tops. While the method of aforementioned U.S. Pat. Nos. 5,353,498 and 5,497,033 potentially can provide a die array sufficiently flat for display and imaging applications, interconnections on the die top surfaces preclude a sufficiently close die-to-die placement for many display and imaging applications.

In addition to close spacing between die, accurate X-Y-Z axis alignment is important for imaging and displaying devices. Placing die, and other small device structures by any means gives rise to the question of tolerance variations and shifts, due to die-attach materials, cooling method and stresses, positioning of pads that hold die-attach materials, and movement induced by placement machine tooling. Even when die can accurately be initially placed, conventional attachment techniques move die from their initial placement. Die attach adhesives have surface tensions which cause die movement. Solvent drying cycles, curing mechanisms, solder or braze differential cooling stresses, all move the die from initial placement. Thus, it is well known that die can be placed with much more accuracy on sticky tape verses placing them by employing die attach adhesives.

Even when a device is correctly initially positioned in the X-Y axis plane, subsequent processing steps, such as employing a flat plate to achieve uniform placement with reference to the Z axis, which is a particular requirement in holography, and other optical arrays, as well as pressure lamination in general, disturb positioning in the plane of the X-Y axis. (Pressure lamination is used extensively in HDI processing.)

It is known that the principle of solder surface tension can be employed to align devices to desired positions over accurately-placed solder-wettable pads on a substrate, to some extent. Examples are disclosed in Napp et al. U.S. Pat. No. 4,836,435, and Braun et al. U.S. Pat. No. 5,118,027. However, bent leads and improperly positioned pads give rise to alignments which are not compensated for. In one technique known as Controlled Collapsed Chip Connection (C-4), solder-bumped die self align or snap-to-grid. These die have in excess of four hundred die pads with small solder bumps approximately 15 mils in diameter on the die. DGA (Die Grid Array Technology) uses the basic C-4 surface tension principle as well. This is widely used in flip-chip technology.

A method which combines die alignment by solder surface tension with planarization is disclosed in Paik et al. U.S. Pat. No. 5,352,629. The die in Paik et al. have their electrical connections on the die top surfaces, and are not sufficiently close together for many imaging and display applications.

SUMMARY OF THE INVENTION

Accordingly, it would be desirable to provide a method for electrically relocating interconnection pads from the top or front surface of a die or other device to the rear or bottom surface, so that interconnected die can be placed nearly edge-to-edge in display and viewing applications, as well as to facilitate placing die on top of finished HDI assemblies. It would also be desirable to fabricate arrays of devices that are placed nearly edge-to-edge in assembly, such as for 3D holographic screens and other video displays, as well as in imaging (viewing) applications.

Other methods which would be useful include: providing precise alignment of pads and other structures on the back (rear) of a device with reference to pads on the top (front) of a device; solving the dilemma of how to place and keep semi-conductor die in precisely accurate positions throughout processing and packaging operations to achieve precision die and array placement such as needed in imaging display and sensing applications; enhancing the HDI embedded chip process by reducing the spacing between individual die, as well as by keeping the die as placed, throughout the embedding and packaging processing steps, avoiding the need for adaptive lithography; minimizing warpage and stress in an array structure employing HDI technology while maintaining accurate die placements; fabricating a balanced stress structure which is inherently flat, after encapsulation, and which maintains that flatness in thermal stress conditions; and eliminating the need for large area ablation from sensitive die by eliminating the polymer overlay employed to support the device interconnections in conventional HDI fabrication technology.

Very briefly, and in overview, one aspect of the invention in effect repatterns a die to relocate top die interconnect pads to the lower surface. Imaging and display die can then be placed tile-like in close proximity, since all interconnections are made to the die lower surface. Another aspect of the invention is the nearly perfect alignment of repatterned die in an X-Y axis plane, as well as with reference to a Z directional axis, by means of solder surface tension and an accurately located rigid alignment structure, such as a pin structure or a grid-like structure, which allows pressure lamination, for planarizing and other purposes, to be accomplished without moving the die from their original X- and Y-axis locations.

More particularly, a semiconductor wafer having front and rear major surfaces is provided, and includes a plurality of device active regions separated by scribe lanes, with top interconnection pads on the front major surface. Holes are formed through the wafer within the scribe lanes. An electrically insulating layer is formed over all exposed surfaces of the wafer, front and back, including within the holes, and openings are made in the insulating layer for access to the top interconnection pads. The wafer and holes are metallized and patterned to form bottom interconnection pads on the rear major surface electrically connected to corresponding top interconnection pads by metallization extending within the holes. Finally, a dicing saw is employed having a kerf width less than the diameter of the holes to separate the individual devices. Since the saw kerf width is less than the hole diameter, at each hole location a portion of the metallized hole remains on each side of the cut, forming electrically conductive channels on the device edges extending top to bottom.

In one embodiment, rear solder-wettable alignment pads are formed while patterning the bottom interconnection pads on the rear major surface and a substrate is provided having, for each of the devices, at least one solder-wettable placement pad on the substrate positioned for mating with the solder-wettable rear alignment pads. If desired, the electrical connection pads can alternatively or additionally be positioned for mating with the bottom interconnection pads. An alignment structure can formed on the substrate and project from the substrate for mechanical engagement with the devices, such as an alignment structure in the form of pins engaging the edge channels remaining where the dicing saw cut through the holes. The devices are placed on the substrate, and the rear alignment pads are soldered to the placement pads, such that the solder surface tension provides initial positional alignment and the original alignment surface provides more accurate positional alignment.

Another aspect of the invention is a method for making an array of closely-spaced imaging or display devices. Wafer segments are formed with relocated top connection pads as described above, and are placed and adhered, front major surface down, to a substrate. Preferably, the substrate and adhesive are optically transparent and can remain in place when the assembly is completed. A multilayer interconnect structure is formed overlying the rear major surfaces of the wafer segments in electrical connection with the relocated bottom interconnection pads, relocated from the top pads. Driver devices appropriate for the imaging or display devices are attached and electrically connected on top of the multilayer interconnect structure.

In one form, the optically transparent substrate is rigid. In another embodiment, the optically transparent substrate takes the form of a stretched polymer film, and a molding material is employed to fix the segments in place. In one variation, a curved focus tool is employed to establish an array curvature, and then molding material is employed to retain the curvature.

Another aspect of the invention is a method for making a multi-device electronic package including a plurality of devices having front and rear major surfaces with interconnection pads on the front major surface, and including High Density Interconnection. At least one solder-wettable rear alignment pad is formed on the rear major surface of each of the devices. A substrate is provided, and for each of the devices at least one solder-wettable placement pad is formed on the substrate positioned for mating with the solder-wettable rear alignment pads. A rigid alignment structure is formed on the substrate, projecting from the substrate, for mechanical engagement with the devices. The devices are placed on the substrate, and the rear alignment pads are soldered to the placement pads. Solder surface tension provides initial alignment and a rigid alignment structure provides more accurate position alignment. A multilayer interconnect structure is formed overlying the devices and interconnecting selected ones of the interconnection pads, employing HDI fabrication techniques as summarized above, but without the need for adaptive lithography.

This invention provides a method for placing small and large semiconductor die, and other active and passive devices (including micro mechanical devices), in closely-spaced precise locations, and in the correct X-Y-Z axis positions.

This invention additionally provides an adaption-free HDI and MCM (multi-chip module) assembly method, which is lower in cost and time to completion than the current HDI process, for example as disclosed in aforementioned U.S. Pat. Nos. 4,783,695 and 4,835,704, and 5,353, 498, and Fillion et al. U.S. Pat. No. 5,455,459.

BRIEF DESCRIPTION OF THE DRAWINGS

While the novel features are set forth with particularity in the appended claims the invention, both as to organization and content, will be better understood and appreciated, from the following detailed description taken in conjunction with the drawings, in which:

FIG. 9 is a view of a wafer segment including a group of four active device regions;

FIG. 10 is a rear view of the segment of FIG. 9, depicting rear solder alignment pads;

FIG. 11 is an alternative to FIG. 10, showing another form of rear solder alignment pad;

FIG. 12 depicts mounting of the FIG. 9 wafer segment to a substrate, with precise alignment by means of die alignment pins;

FIG. 13 depicts the use of a polymer grid-like alignment structure;

FIG. 19 depicts the use of a curved focus tool;

FIG. 22 illustrates the formation of an HDI overcoat structure, with components on top of the interconnect structure;

FIG. 23 depicts a finished structure with an optically clear polymer layer left in place; and FIG. 24 depicts a finished structure with the optically clear polymer layer removed.

DETAILED DESCRIPTION

Figure 1:
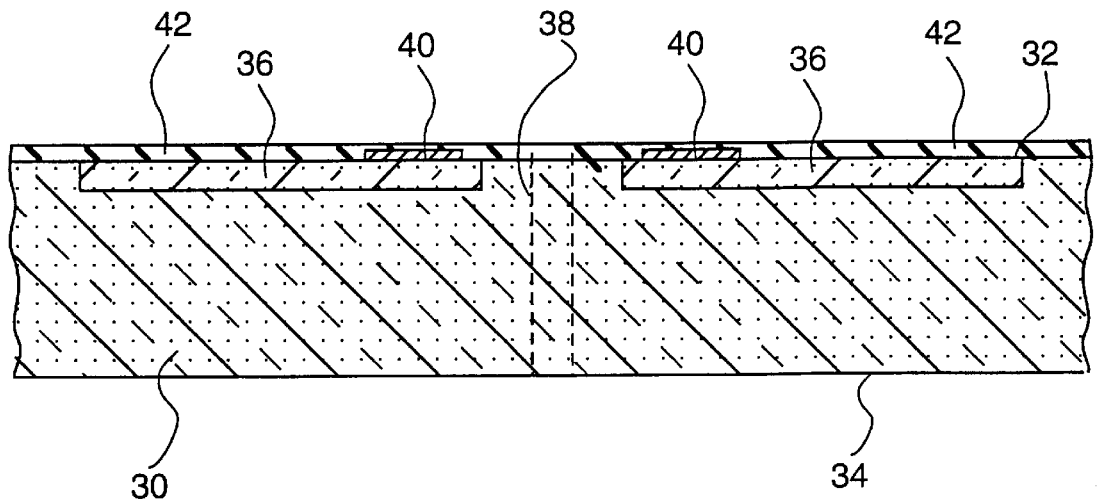
FIG. 1 is a cross-sectional view of a semiconductor wafer undergoing initial steps of processing in accordance with the invention.

With reference to FIG. 1, one aspect of the invention is the repatterning of die to relocate top die interconnection pads to the bottom. Represented in cross-section in FIG. 1 is a semiconductor wafer 30 having front (top) 32 and rear (bottom) 34 major surfaces, and a number of active device regions 36 within wafer 30. In the case of display or imaging devices 36, front or top surface 32 is also the optically active surface.

As is known, a semiconductor wafer 30 takes the form of a disk ranging from one inch to ten inches in diameter. Typically, hundreds of individual active device regions 36 are made on a wafer 30, and then separated into individual devices employing a dicing saw cutting along dicing saw lanes 38, also known as scribe lanes 38. In general, each individual device sawed from wafer 30 and including an active device region 36 comprises what is known as a semiconductor die. The terms active device region 36 and die 36 are employed interchangeably herein.

For purposes of illustration, in FIG. 1 only two active device regions 36 are shown. On top major surface 32 active device regions 36 have top interconnection pads 40, which typically are aluminum. Each active device region 36 may have hundreds of top interconnection pads 40, which in the case of imaging or displaying devices are located near the periphery of active device region 36. Wafer 30 is coated with a protective, removable photoresist material layer, which provides top surface debris protection.

Figure 7:
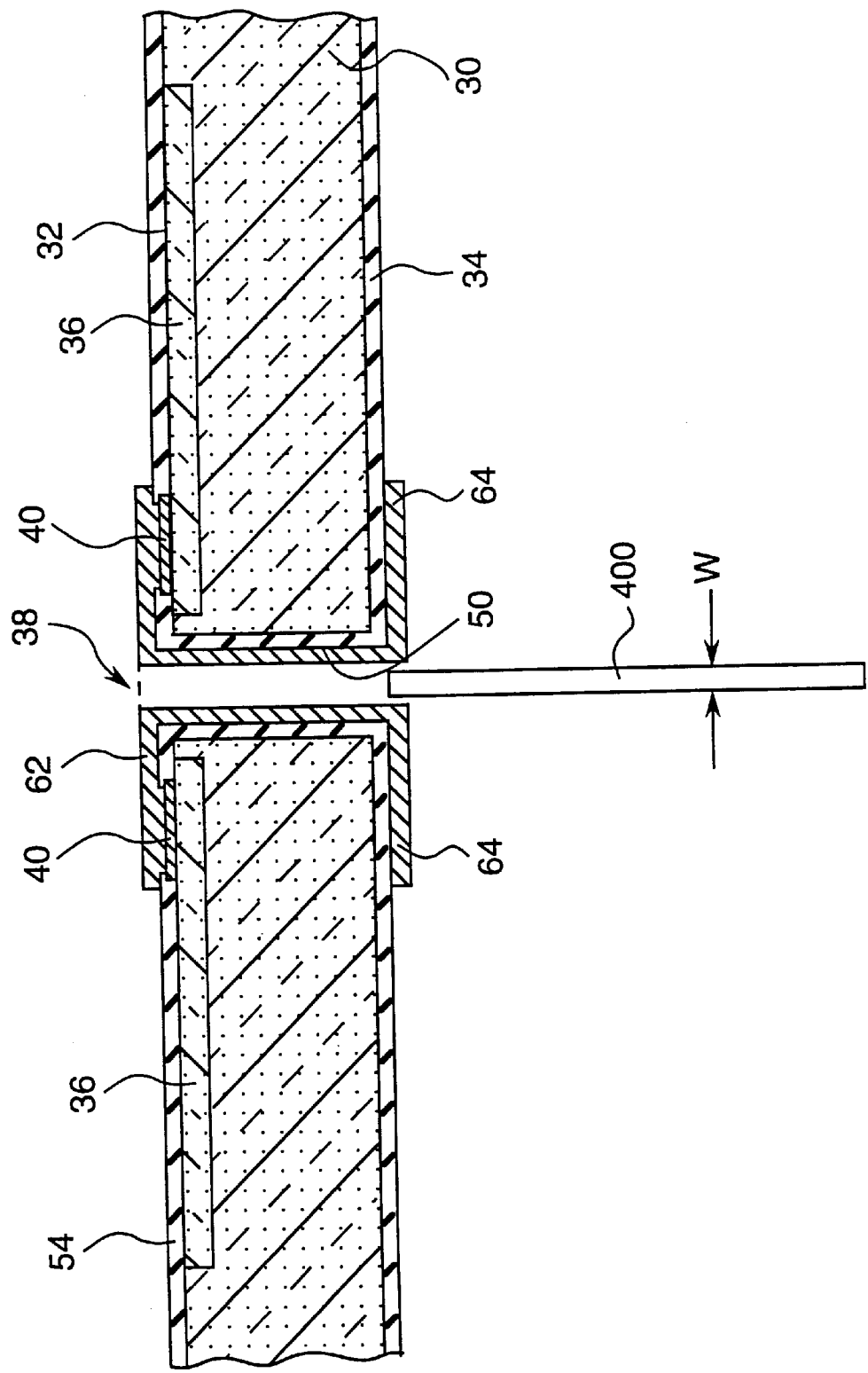
FIG. 7 depicts the result of a dicing saw cut through the holes.

Scribe lanes 38 or dicing saw lanes 38 separating device active regions 36 (depicted in FIG. 1 as dash lines) also represent the kerf width W of a dicing saw (shown as saw 400 in FIG. 7). In general, device active regions 36 are subsequently sawed apart into individual die or devices.

In the present invention, wafer 30 can be sawed into wafer segments each including several active device regions 36 in an integral group, such as a sub-array of four or sixteen active device regions 36. With conventional practice this would not be practical, as wire bond connections could not reach all of the interconnection pads 40, and an HDI interconnection structure would be impractical for an imaging or display array. For an integral group of active device regions 36 which are not sawed apart, wafer processing can be optimized for the array, in particular by making scribe lanes 38 narrower than is conventional, such as by making the scribe lanes 3 mils (0.003 inch) wide.

Figure 2:
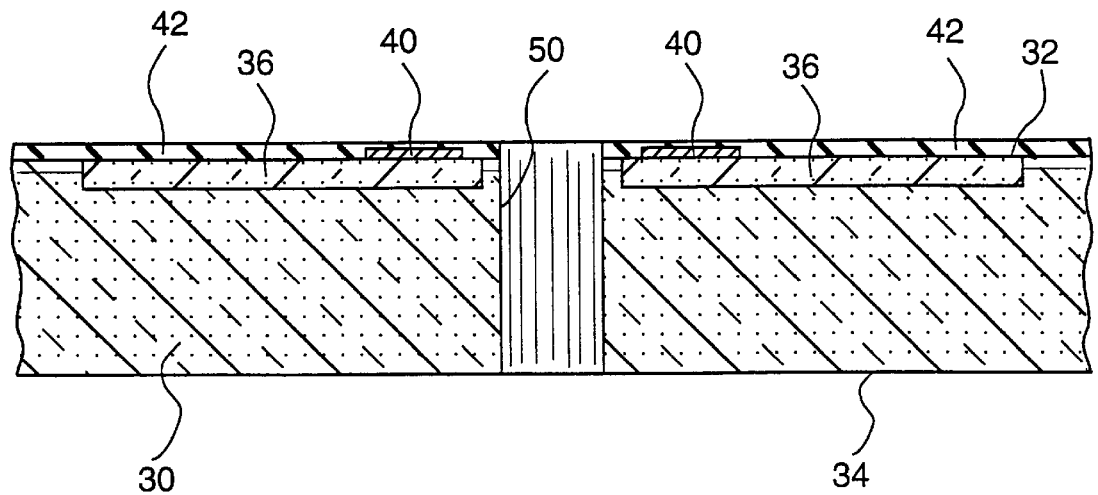
FIG. 2 depicts the wafer of FIG. 1 with holes drilled.

As depicted in FIG. 2, holes 50 are drilled through wafer 30 in saw lanes 38. Holes 50 may be formed in a number of ways, but a computer controlled laser, such as a 514 nm YAG laser is preferable.

In general, there is one hole 50 for each top interconnection pad 40, except that a single hole 50 can serve pads 40 of two adjacent active device regions 36 where adjacent active device regions are sawed apart as described below with reference to FIG. 7, so that holes 50 are divided in two (resulting in a half-barrel appearance), thus minimizing the number of holes 50 required. Holes 50 may be provided along the sides of active device regions 36, between two adjacent die 36, or may be placed at the intersection of four corners.

After drilling holes 50, an etch may be employed to enlarge holes 50 so that they are larger than the kerf width of the dicing saw blade, to profile holes 50, and to provide stress relief in general. Protective layer 42 is removed, and wafer 30 is cleaned.

Figure 3:
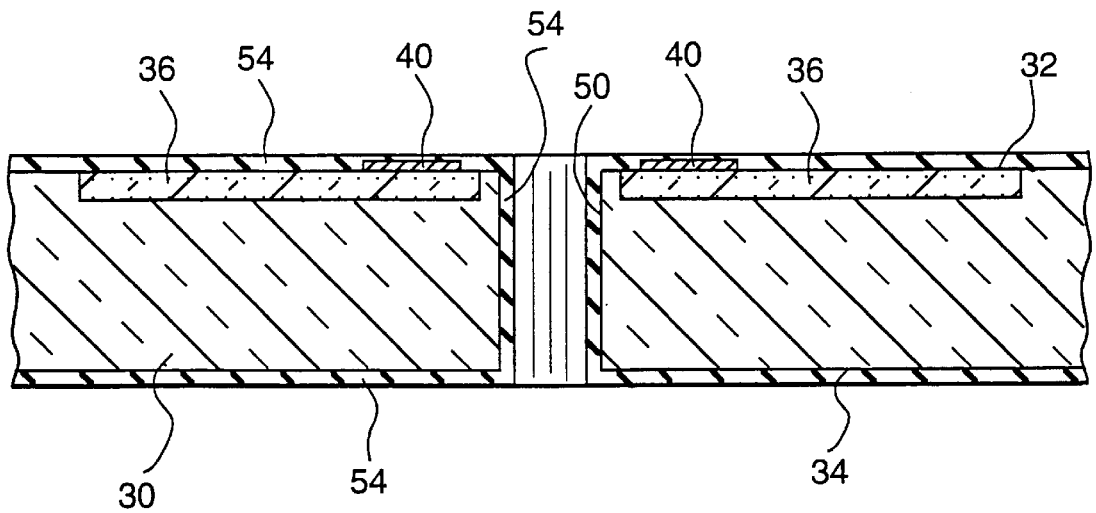
FIG. 3 depicts the wafer with an insulating coating over all exposed surfaces.

Referring next to FIG. 3, an insulating coating 54 is formed on all exposed surfaces of wafer 30, including top 32, bottom 34 and within holes 50. A preferred material for insulating coating 54 is paraxylene, a dimer monomer that coats by a well-known CVD (chemical vapor deposition) reactor process. A characteristic of paraxylene is that it coats evenly everywhere, even over razor blade edges. Paraxylene is sold under the trademark PARALENE, previously available from Union Carbide, and currently from Specialty Coatings Systems, Indianapolis, Ind. Other suitable materials for insulating coating 54 are diamond-like carbon (DLC), and various CVD inorganic oxides such as SiO, $SiO_2$ and $TiO_2$.

Figure 4:
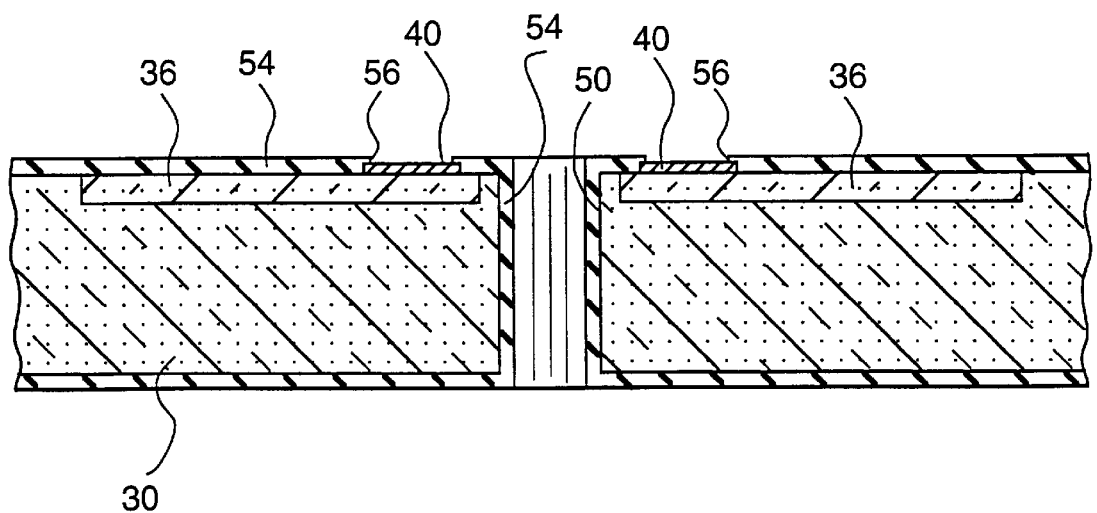
FIG. 4 depicts the step of forming openings in the insulating layer to provide access to top interconnection pads.

With reference to FIG. 4, openings 56 are formed in insulating layer 54 to provide access to top interconnection pads 40. To form openings 56, material of layer 54 is removed by an excimer laser that ablates the material away, or a suitable mask may be provided to allow RIE, plasma ashing or chemical etching. It may be noted that in most designs a top pad etch mask to remove glass from pad 40 already exists.

Figure 5:
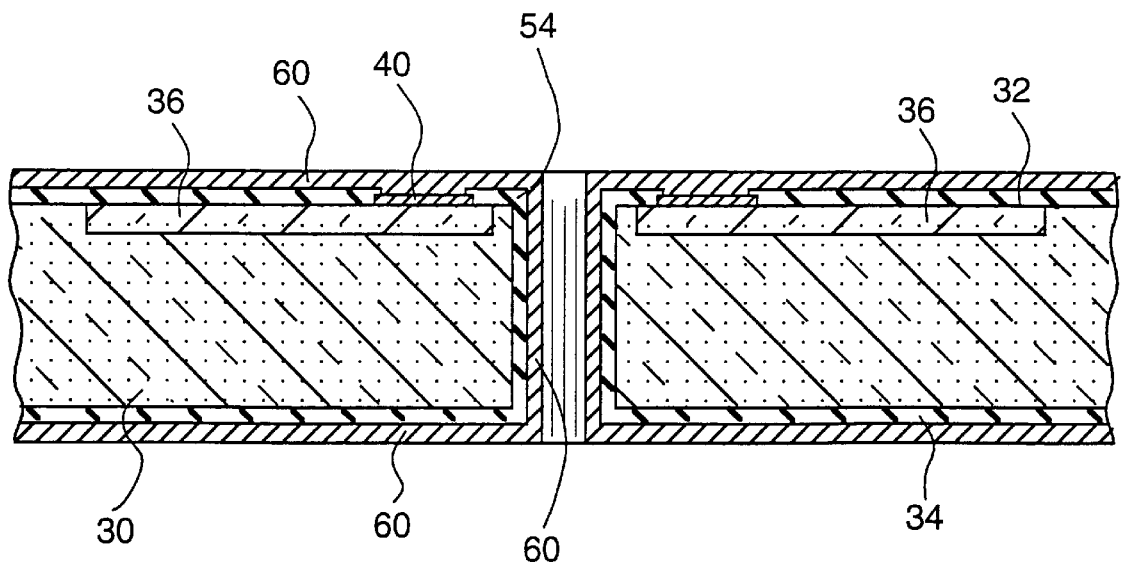
FIG. 5 depicts a metallizing step.

With reference to FIG. 5, wafer 30, with access to pads 40 opened, is cleaned, and placed in a sputtering machine, backsputtered and metallized on both sides, forming metallization 60. For example, an adhesion promotion and barrier layer of metal such as Cr, Ti, TiW, or NiCr is first applied, followed by a conducting metal layer of one or more different metals which is several microns thick, such as Al, Au, Pt, or Cu. Alternatively, a metal such as Au, W, or Al may be deposited by CVD processing.

Figure 6:
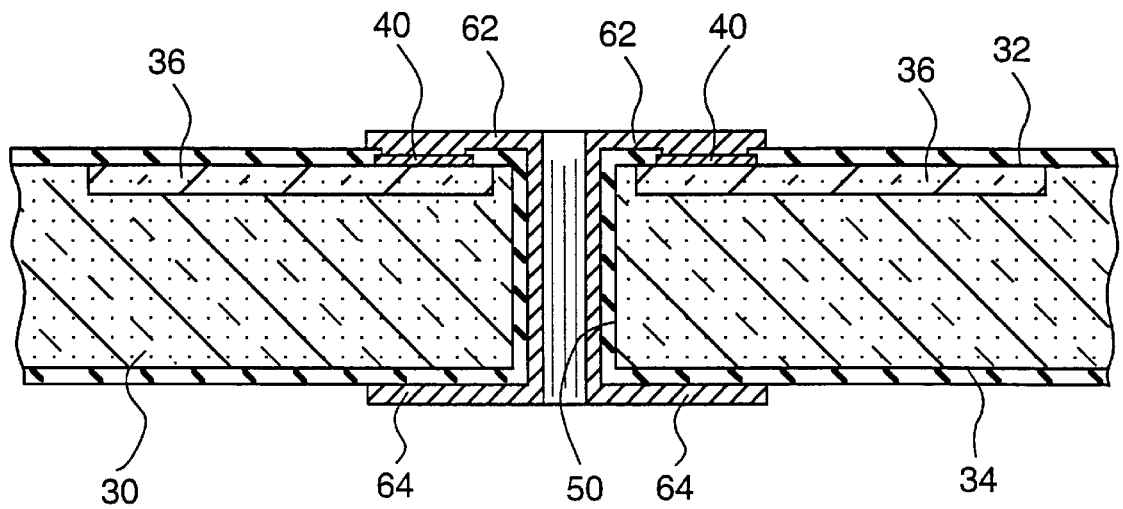
FIG. 6 depicts patterning of the metallization to form relocated pads on the bottom of the device.

A resist (not shown) can be applied to wafer 30, covering all surfaces. The resist can then be patterned employing a laser, with the top and bottom in proper registration. As shown in FIG. 6, the resist is developed and all excess metal removed, leaving patterned metal 62 by which top wafer pads 40 are electrically relocated to metal pads 64 on the bottom 34 of wafer 30.

Referring to FIG. 7, wafer 30 is next sawed in at least some of the dicing saw lanes 38, employing a dicing saw 400 having a kerf width W less than the diameter of holes 50. Thus, each metallized hole 50 is divided in two, resulting in a half-barrel appearance. At each hole 50 location, a portion of the hole 50 remains on each side of the cut, defining metallized channels on the device edges extending between top 32 and bottom 34 surfaces. Groups of pads, such as power or ground pads, may be interconnected either on the top or bottom. With hundreds of pads and corresponding numbers of holes 50, the resulting device edges have a serrated appearance.

The now-separated devices, either as individual devices, or as wafer 30 segments each including several active device 36 regions in an integral group, are inspected, and are ready for assembly. Paraxylene insulating layer 54 can be removed by reactive ion etching if desired.

Described below are a number of mounting and packaging embodiments.

Figure 8:
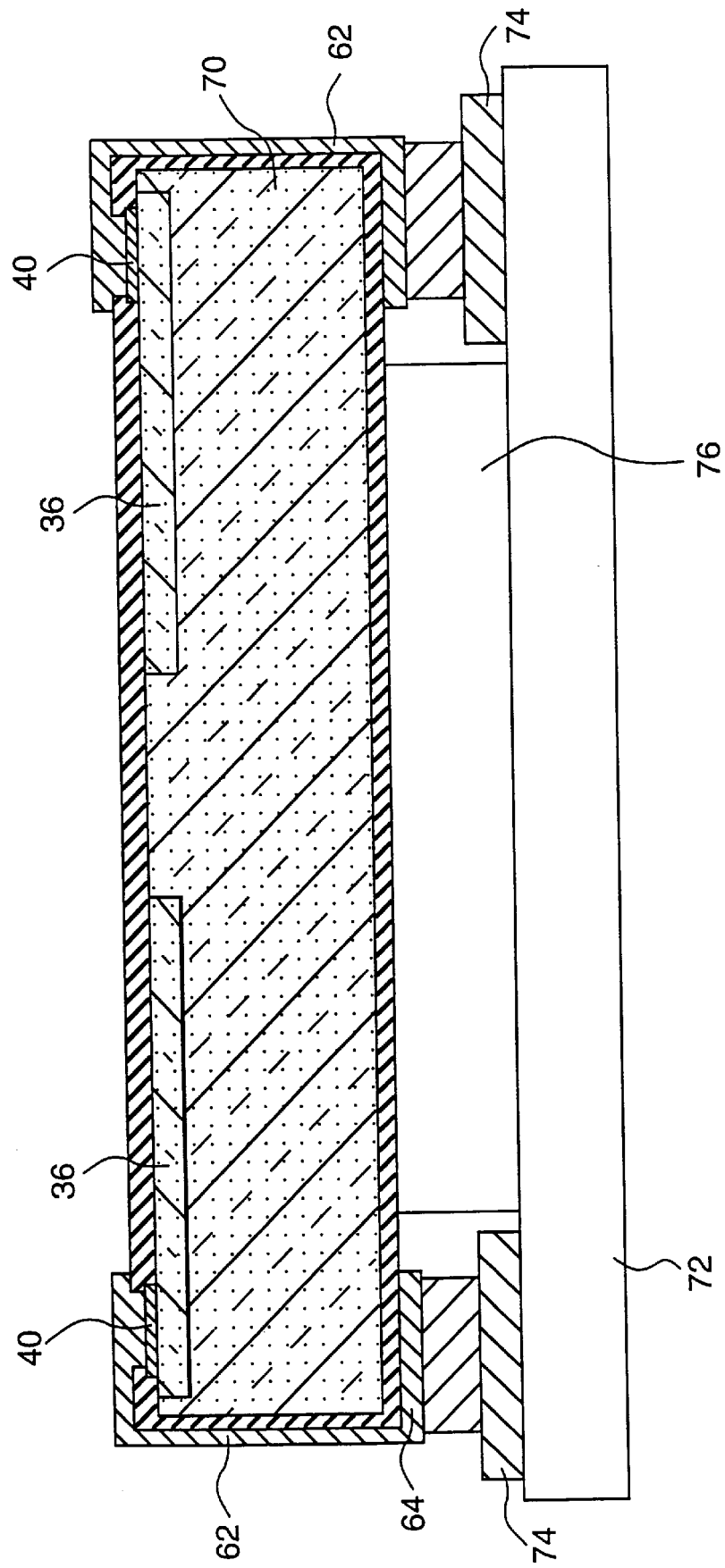
FIG. 8 represents a semiconductor wafer segment with relocated top connection pads, mounted to an HDI substrate.

FIG. 8 in general overview is a cross-section of a wafer segment 70 with two active device regions 36 visible, each having top connection pads 40 electrically through hole metallization 62 to bottom pads 64, attached to an HDI substrate 72. It will be appreciated that a plurality of such wafer segments 70 (or die having individual active device regions) may be placed nearly touching edge-to-edge. An additional insulating layer (not shown) can be formed over metallization 62 after sawing to allow wafer segments 70 or die to abut without short circuiting. Bottom pads 64 are electrically connected and attached to connection pads 74 on HDI substrate 72. Also shown in FIG. 8 is optional heat sink material 76, which may be particularly useful for high power devices. Heat sink material 76 may be a solder paste, thermally-conductive epoxy, or other thermally conductive underfill material.

Referring next to FIG. 9, a wafer segment 80 includes a group of four active device regions 36, such as regions 36A, 36B, 36C and 36D, on top major surface 32.

FIGS. 10 and 11 represent alternative embodiments, and depict alternative forms of rear solder alignment pads 82 and 84, or 86, on bottom major surface 34 of wafer segment 80. FIGS. 10 and 11 also could represent the bottom surface of a die supporting a single active device region 36. Rear solder alignment pads 82 and 84 or 86 are formed at the same time as relocated rear pads 64 (not shown in FIGS. 10 and 11) described above with reference to FIG. 6.

In FIG. 10, there are two relatively small rear solder alignment pads 82 and 84, and in FIG. 11 there is a single relatively large rear solder alignment pad 86. In either case, it is important that solder alignment pads 82 and 84 or 86 be accurately aligned or positioned with reference to features on the front major surface 32.

Figure 14:
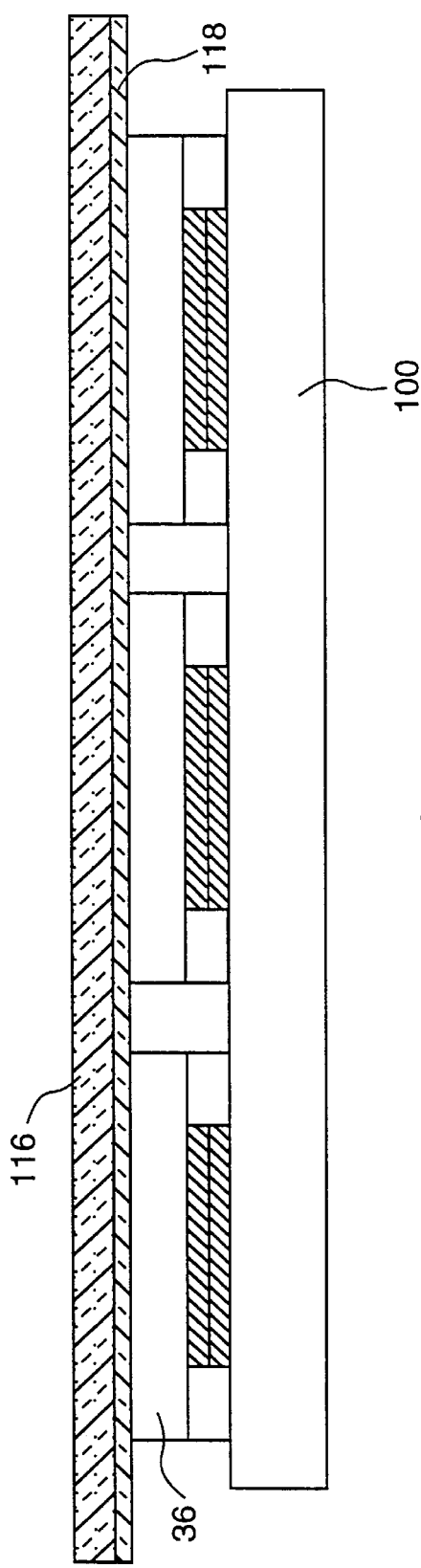
FIG. 14 depicts the application of an HDI overcoat to provide interconnections.

As one example, alignment holes 90, which are accurately located with reference to device features on top surface 32, are formed in scribe lanes 38. Alignment holes 90 may comprise at least some of the holes 50, described above with reference to FIGS. 1–7, employed for electrically relocating top die pads 40 to bottom pads 64. Alternatively, alignment holes 92 may be placed in unused areas of device active region 36. The number and size of holes 50 and 92 are dependent on the pins, or other holding fixture, that are used in processing, as illustrated in FIGS. 12–14, described below. Alignment holes 90 or 92 can be made by chemical etching, laser drilling, ultrasound milling, high pressure water jet, mechanical machining or other suitable process.

Alignment holes 90 or 92 thus are employed to locate with precision solder alignment pad structures 82 and 84 or 86 of FIGS. 10 and 11. It should be noted that alignment holes 90 or 92 may not be needed if other accurate means are used to align front 32 and rear 34 major surfaces of wafer 30 very accurately, and Z axis planarity is not critical (since these same holes 90 can be used for engagement with a precision pin alignment structure, described below with reference to FIGS. 12–14). This issue is dependent upon the degree of accuracy that is needed. For <1 micrometer accuracy, alignment holes 50, 90, and 92 are used to factor out misalignments in the photo-masking process, as well as within the alignment equipment itself.

If not formed at the same time as pads 64 in FIG. 6, or if a special back side contact is needed to electrically bias the die, holes may be made in insulating layer 54. Rear solder alignment pads 82 and 84 or 86 in FIGS. 10 and 11 are made by applying photoresist or solder resist to rear 34 of wafer 30, by spin or other appropriate processing. The photoresist is then patterned, such as by laser lithography or masking, to define the exact positioning of the rear alignment pads 82 and 84 or 86 of FIGS. 10 and 11, using the alignment holes 90 or 92 as reference points. A backsputter cleaning step cleans wafer 30, and then a forward sputtering step deposits an adhesion layer, such as a 1000 angstroms thick layer of titanium, onto the rear of the wafer. This is followed by deposition of a layer of copper, nickel, gold, or other suitable material 5000 angstroms to 12 angstroms in thickness.

Electroplating is then employed to build up the thin metal layer, as defined by the photoresist, to an additional metal thickness of 3–10 micrometers to support solder. This is followed by electroplating, or sputtering to apply a 1000 angstroms to 5000 angstroms layer of material such as Ni or Pd, as a solder diffusion (leach) barrier.

This in turn is followed by solder plating with a material such as an SnPb, AuSn or InPb alloy to form a void free solder bond to the underlying metallization. Generally this solder plating is 1–20 micrometers in thickness. All metals are chemically etched and patterned at this point, and photoresist is removed. Solder resist is left in place. The solder may be reflowed by many known means, such as IR, vapor phase solder reflow, or over reflow, at this point for minimum porosity formation in the solder joint. This solder reflow optionally may be done at the time of assembly simultaneously with solder reflow of mating solder-wettable placement pads 102 (shown in FIG. 12).

Referring to FIG. 12 a substrate 100 of a material preferably having a low coefficient of thermal expansion (CTE) to match the die 36 CTE is employed. Examples of suitable materials include, kovar alloys, molybdenum, tungsten, and metals, ceramics, and other elements including silicon. The better the CTE match, the better the tracking of the CTE will be over temperature excursions. In one embodiment, a substrate 100 comprises kovar and is used with processing steps similar to those described above for the wafer 30 and is preformed to form mating solder-wettable placement pads 102. Generally kovar is coated with a corrosion-resistant layer of nickel at least 1000 angstroms in thickness.

After both wafer 30 substrate 100 are processed as noted above, wafer 30 is sawed into segments corresponding to individual devices 36. The alignment holes 90, which may comprise the same holes 50 employed for relocating top die pads 40 to bottom pads 64 as described above with reference to FIGS. 1–7, may be sawed through their centers, to give a half barrel appearance from an edge view.

Holes 50 or 90 can serve yet another purpose, which is to engage with pin fixtures for accurate positioning of die or wafer segments in the X-Y axis plane. For this purpose, typically only three or four pins 104 are used per device or wafer segment, engaging either selected ones of the sawed-through holes 50 or 90, or additional sawed-through holes made for that purpose.

FIG. 12 accordingly additionally illustrates precise location of die 36 by die alignment pins 104, and their mounting to substrate 100. These pins 104 are chosen to fit the sawed-through hole contour, or they may span two or more die 36 at once. This is dependent on whether the die 36 edges or corners are used. One pin may interface with four die at the corners. Pins 104 may be formed by machining or etched. Pins 104 may be round, square or diamond-shaped in cross section, for example. In addition, pins 104 may be tapered to form a wedge-like fit. Pin 104 size is selected with reference to distance between die 36. To avoid electrical short circuits, pins 104 may be insulated, or made of a non-conducting material. Pins 104 may subsequently be etched away or otherwise removed if desired.

Die 36 and substrate 100 are then attached with solder or an epoxy to form a joint. More particularly, rear alignment pads 82 and 84 or 86 are attached to the placement pads 102. Appropriate fluxes can be used. The use of an inert gas or vacuum for the soldering minimizes the formation of oxidizing by-products.

FIG. 13 illustrates precise location of die 36 by the use of a ceramic or polymer grid-like structure 114 such as an egg crate structure. Structure 114 is cast in place and does not generally require the use of the holes in the die edges. Grid-like alignment structure 114 is particularly suitable in cases where pre-cut die 36 are used rather than whole wafers. The die 36 are sawed and then machined such as by laser for an exact tolerance. This grid 114 material may be a water removable cement, like plaster of paris, or it may be a fritted inorganic cement or a cured or solvent dried polymer material such as a low CTE polyimide or epoxy. Solvents for the polymers may be used to subsequently remove the polymers if desired.

FIG. 14 illustrates how HDI lamination type fixture, may be used to press the die flat and form a uniform planar, precision structured array of die 36. The precisionally placed sub-assembly of FIG. 13, is the basis for a maskless HDI laminated assembly process. Normal HDI processing may be used also, as noted in aforementioned U.S. Pat. Nos. 5,497,033 and 5,353,498.

In FIG. 14, a polyamide layer 116 with an adhesive layer 118 is laminated to the devices 36 employing a lamination press (not shown). In particular, heat is applied to reflow solder the die 36 while the die 36 are held by the rigid alignment structure (pins 104 or grid 114). The heat can be applied as disclosed in aforementioned U.S. Pat. Nos. 4,933, 042 and 5,094,709.

Die 36 are held under pressure until the solder joint is well cooled. This step is preferably the highest temperature step of the process. Subsequent processing should not soften the solder because softening could cause a change in device positioning.

Figure 15:
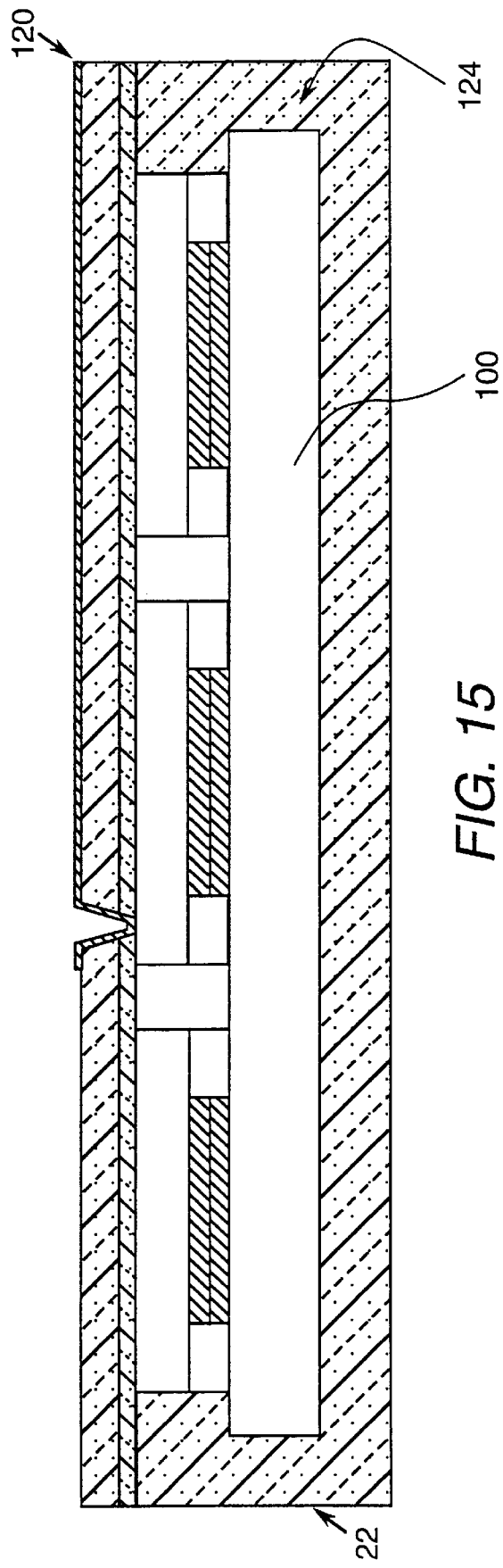
FIG. 15 illustrates incorporation of the FIG. 14 structure into an encapsulated MCM assembly.

FIG. 15 illustrates the incorporation of the substrate 100 and HDI processed circuit 120 into an MCM (multi-chip module) assembly 122, employing encapsulation 124. Substrate 100 holds the die 36, as placed, and also serves as a core plate that retains the flatness during processing, and packaging. Preferably the substrate is coated or has a sputtered or electroplated layer of nickel or titanium over it for adhesion and corrosion resistance. The use of a substrate eliminates the warpage that can occur in the encapsulation step due to the shrinkage of the epoxy during cure. In addition, substrate 100 structurally stabilizes MCM 122.

Figure 16:
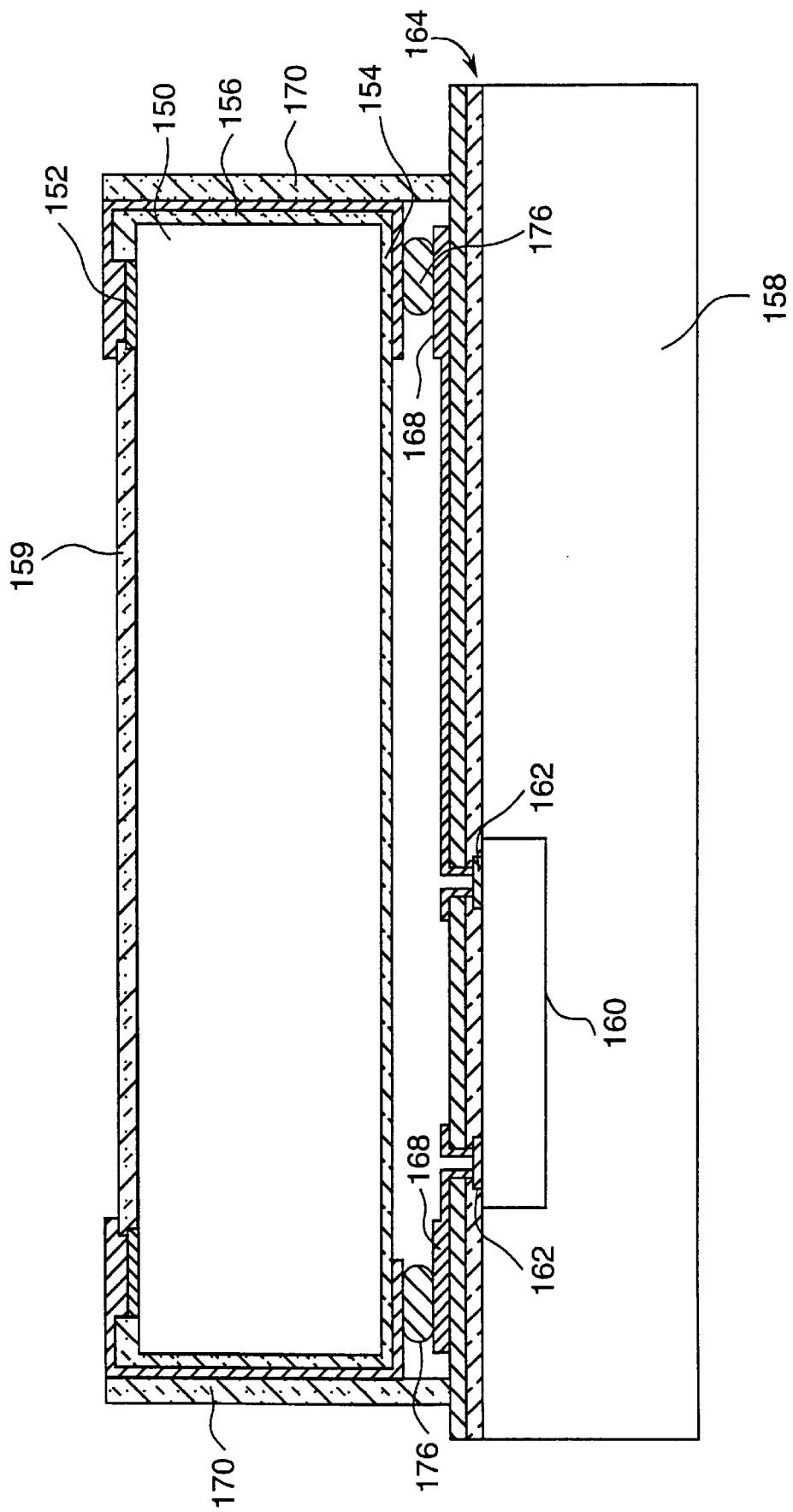
FIG. 16 depicts the mounting of an optical imaging or display die to the top of a multi-chip module.

FIG. 16 depicts the manner in which an optical display or imaging die 150, which has been repatterned to electrically relocate top connection pads 152 to the bottom at 154 over an insulating coating 156 corresponding to insulating coating 54 described above with reference to FIG. 3 is mounted to the top of a multi-chip module (MCM) 158 fabricated employing HDI fabrication techniques as summarized above and as disclosed in aforementioned U.S. Pat. No. 4,783,695, aforementioned U.S. Pat. No. 5,200,810, for example. Die 150 has a viewing or display area 159, which is unobstructed. Although an HDI MCM 158 is shown in FIG. 16, display or viewing die 150 alternatively could be attached to a flat planar, low CTE surface, with a layered printed circuit board (PCB) with connection metal on top or an HDI interconnect structure attached.

HDI MCM 158 includes suitable circuitry, represented by a driver die 160 appropriate for the display or viewing die 150. The driver die 160 has top interconnect pads 162, and an HDI overcoat structure 164 on top of the substrate electrically connects driver die 160 interconnection pads 162 to solder pads 168.

Supported on the HDI MCM are alignment pins 170, which engage the sawed through holes on the die 150, as described above with reference to FIGS. 12–14.

Die 150 relocated bottom pads 154 are electrically connected to substrate top pads 168 employing micro BGA solder balls 176, which reflow when heated to a temperature above the melting point of the particular solder employed.

In this particular embodiment, the solder areas as illustrated are small with reference to the total mass of the die 150, and accordingly do not function well in snap-to-grid mode. Accordingly, precision alignment pins 170, or other alignment structure, are important for achieving proper alignment.

Although only a single die 150 is shown in FIG. 16, it will be appreciated that die 150 is part of a two-dimensional array of precisely positioned, closely-spaced display or viewing die 150.

Many viewing die 150, such as those made of HgCdTe and InSb, cannot withstand commonly used solder temperatures. Accordingly, rather than micro BGA solder balls 176, conductive epoxy (loaded with silver particles) is employed to attach die 150, while making electrical contact between the bottom relocated pads 154 and substrate top pads 168. Epoxy does not have a tendency to snap-to-grid, as solder does. Accordingly, alignment pins 170 are particularly important where conductive epoxy is employed to attach and electrically connect a viewing or display die 150.

Figure 17:
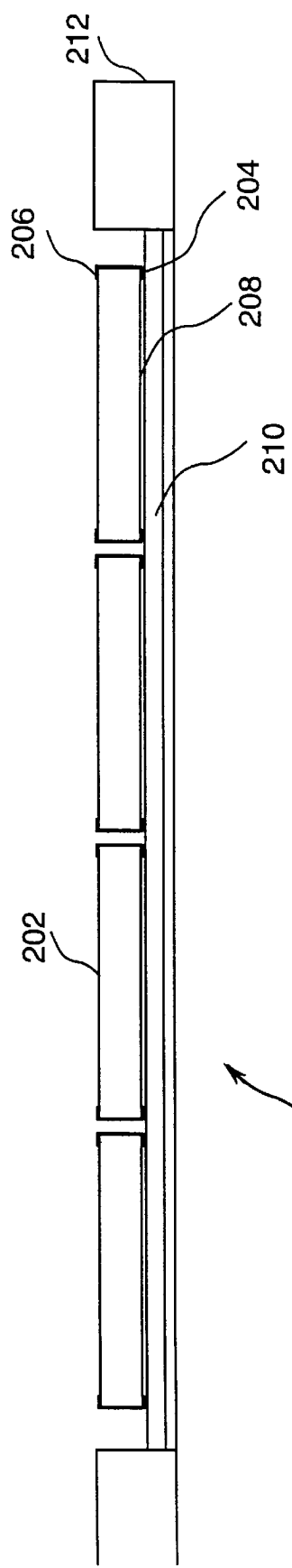
FIG. 17 depicts an initial step in a process for forming a viewing or imaging die array structure.
Figure 18:
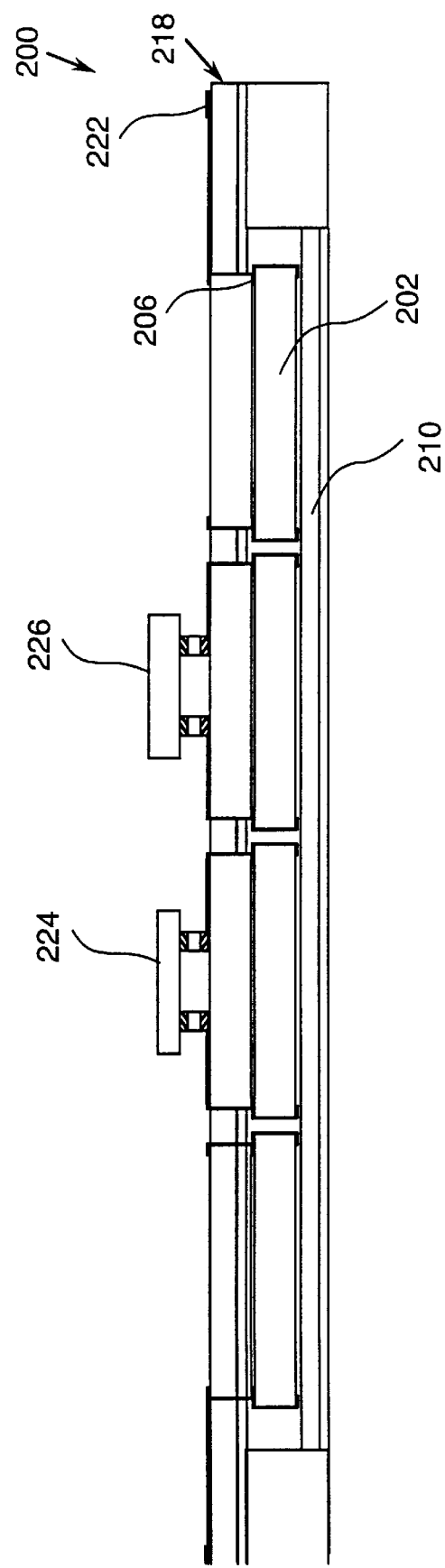
FIG. 18 depicts the resultant viewing or imaging die array structure.

FIGS. 17 and 18 illustrate a process and a resultant viewing or imaging die array structure 200. In FIG. 17, representative viewing or display die 202 are repatterned with top die interconnect pads 204 relocated to back connection pads 206, with die viewing or display areas 208 on the front surfaces.

In FIG. 17, an initial support surface 210 comprises a polymer film 210 stretched over a support frame 212, which typically is circular. Support 210 is optically clear over light wavelengths of interest during operation of the viewing or display die 202. Alternatively, support 212 may comprise a thin sheet of glass or quartz-like material. In either case, a thin coating of tacky adhesive (not shown) can be applied to one surface, optically transparent over the wavelengths of interest. Repatterned die 202 are placed, active side down, to the surface as illustrated in FIG. 17, held in place by the tacky adhesive, and cured in place.

Although not shown in FIG. 17, it will be appreciated that a suitable alignment structure, such as a pin or grid structure, may be employed on the support base 210 for accurate alignment of the die 202. For a grid-like alignment structure, a patterned wall, for example made of a patterned photoresist or solder mask, several mils in thickness may be built up on the polymer film 210. An excimer laser may be used to trim the photoresist or solder mask to exact tolerances.

As shown in FIG. 18, an HDI overcoat structure 218, beginning with a polyimide dielectric film, is built up over the backs of the die 202, and connections are made to relocated pads 206. The front polymer film or quartz layer 210 and the back lamination comprising HDI overcoat structure 218 stabilize the structure 200 from a tendency to warp in process, as a balanced stress condition is achieved.

As described in aforementioned U.S. Pat. No. 4,783,695, for example, vias are formed through the polyimide by laser ablation, to provide access to relocated pads 206. A variety of methods of making the via holes can be employed, such as with an excimer laser employing a mask, or chemical etching.

The vias making connections with relocated pads 206 may be metallized by sputtering and electroplating, as noted for example in aforementioned U.S. Pat. No. 4,783,695.

The die 202 with relocated interconnection pads 206 provide a significant advantage in the context of the HDI overcoat process, compared to conventional practice where die pads are made of aluminum. Thus, relocated pads 206 may be chosen to be compatible with chemical etches, which are not acceptable for typical aluminum pad material.

Accordingly, a PdSnCl PCB process may be employed that metallizes the via holes and forms copper directly on to the repatterned die metal, which is chosen to be compatible with this process. The repatterned die metal, for example, may comprise copper or gold over tungsten over molybdenum. This is a lower cost method of metallizing that does not need a sputtering step when the relocated pads 206 are made of a compatible metal. With ordinary top die interconnection pads, this cannot be done.

After metal application, the metal is patterned and top pad areas are formed as disclosed in aforementioned U.S. Pat. No. 5,200,810, for example. On top of the HDI overcoat layer 218, there can be input and output (I/O) interconnection pads 222, as well as representative driver devices in the form of chips 224 and 226, electrically connected to imaging or display die 202 through HDI overcoat layer 218. In one embodiment, these chips comprise video line arrays and microwave modules, for example.

For mounting chips 224 and 226, top pad areas are formed as noted in aforementioned U.S. Pat. No. 5,200,810. Flip-chip die such as C-4 processed die are employed for this application. Additionally, ball grid array (BGA) areas are patterned for accommodation of a BGA driver chips. In addition, leaded or other surface mount technology (SMT) components may be used.

Typically, the HDI overcoat structure 218 is a multi-lamination as disclosed in Gorczyca et al. U.S. Pat. No. 5,161,093.

The structure 200 depicted in FIGS. 17 and 18 does not include a molding step, as does the structure of aforementioned U.S. Pat. Nos. 5,353,498 and 5,497,033. Structure 200 may be bonded to an optically clear structure for additional support such as thick quartz plate.

Alternatively, and as shown in FIG. 19, structure 200, if flexible, can be conformed to a contour pattern to establish a special curvature to an array to accommodate specialized array focusing applications. In FIG. 19, a curved focus tool 230 is employed to establish the curvature, and a suitable molding or potting compound 232 is applied to the rear. Alternatively a temporary vacuum may be employed to produce a curvature.

Figure 20:
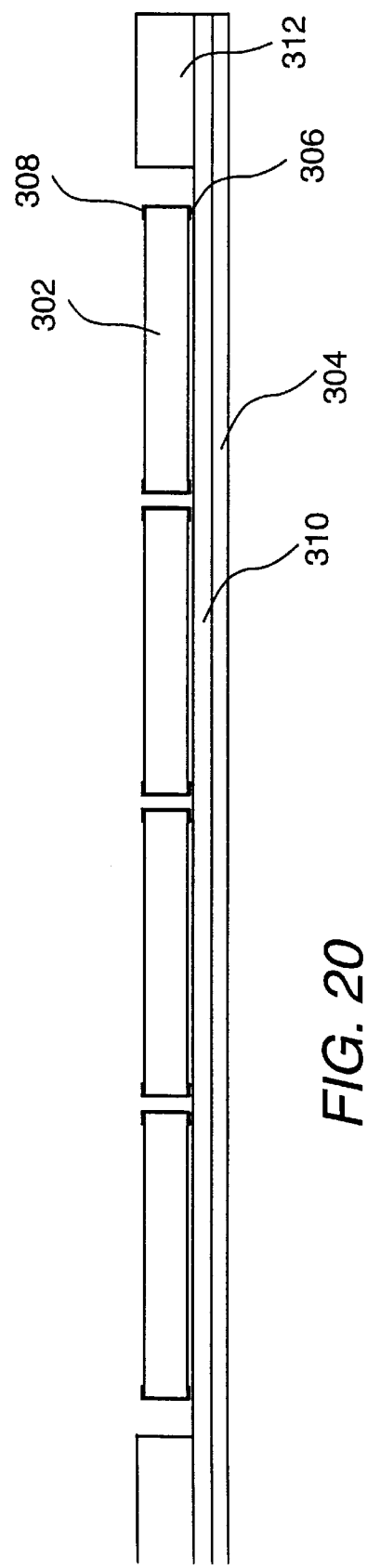
FIG. 20 depicts an initial step of another method for forming a viewing or imaging die array structure.

FIGS. 20–24 illustrate an alternative method and structure, with employs a molding step, as disclosed in aforementioned U.S. Pat. Nos. 5,353,498 and 5,497,033 for additional mechanical structure. FIG. 20, in a similar manner as FIG. 17, shows repatterned die 302 with active display or viewing surfaces 304, and top interconnection pads 306 relocated to bottom connect pads 308, placed in close proximity on a polymer film layer 310. The polymer film layer 310 is stretched over a carrier frame 312, much like a drum head, and has a layer (not shown) of tacky adhesive or wax. Polymer film layer 310 may either be subsequently removed, or become permanent if desired. The adhesive is chosen to be dissolvable by a solvent that does not remove anything else.

Figure 21:
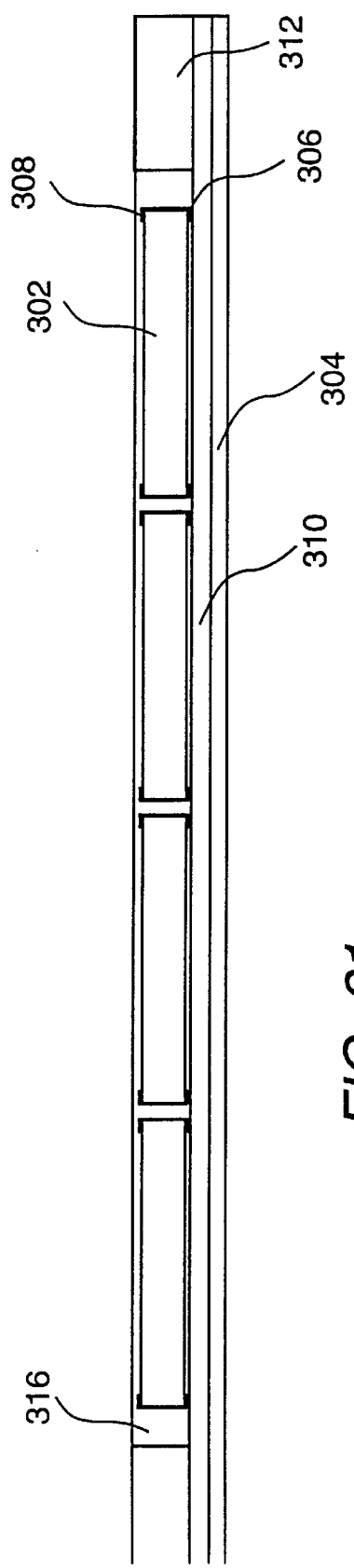
FIG. 21 illustrates a subsequent step of applying molding compound.

In FIG. 21, a molding compound 316 is applied to the repatterned back side of the die 302, employing the HDI plastic process as disclosed in aforementioned U.S. Pat. No. 5,353,498, Fillion et al. U.S. Pat. No. 5,353,195 and especially Gorczyca et al. U.S. Pat. No. 5,492,586. The molding is done so as not to embed the repatterned die pads 308, employing a flat plate coated with a release agent, as disclosed in aforementioned U.S. Pat. No. 5,492,586. The array is removed from the molding fixture (not shown) and prepared for subsequent processing.

In FIG. 22, an HDI overcoat structure 318 is laminated over the backs of die 302, die 302 having been molded in perfect Z plane alignment. The HDI lamination 318 uses a low temperature glue such as is disclosed in Cole et al. U.S. Pat. No. 4,897,153. Adhesive is applied to the polyamide and vacuum pressure laminated as described in aforementioned U.S. Pat. No. 5,094,709. After the lamination step, vias are formed, metallization is preformed, and top mounted components are applied.

The resultant structure may be used as illustrated in FIG. 22, or lead frame 312 may be trimmed off as in FIG. 23, leaving front polymer layer 310 in place for increased structural stability. As another alternative, shown in FIG. 24, the front polymer layer may be removed entirely by a dissolving solvent or etch, revealing the die viewing areas 304. The techniques of Eichelberger et al. U.S. Pat. No. 4,878,991 may be employed, for example.

As depicted in FIG. 23, polymer layer 310 may be left in place if it is optically clear at the wavelengths of interest, and does not inhibit the operation of the array, as it gives enhanced stress relief against warpage, and protection against mechanical handling damage.

While only certain preferred features of the invention have been illustrated and described herein, many modifications and changes will occur to those skilled in the art. It is therefore to be understood that the appended claims are intended to cover all such modifications and changes that fall within the true spirit and scope of the invention.

What is claimed is:

1. An array of closely-spaced devices comprising:
    a plurality of electrical devices, each electrical device including
        top interconnection pads on a front major surface,
        an electrically insulating layer on the front major surface and a rear major surface, and a portion of at least one side surface, with openings in the insulating layer for access to the top interconnection pads,
        patterned metallization on the front and rear major surfaces and over the portion of at least one side surface forming bottom interconnection pads and alignment pads on the rear major surface, the bottom interconnection pads electrically connected to corresponding top interconnection pads by metallization extending over the electrically insulating layer on the portion of the at least one side surface; and
    a multi-chip module having a high density interconnect overcoat structure with at least two electrical connection pads positioned for mating with the alignment pads and a rigid alignment structure projecting from the multi-chip module for mechanical engagement with the electrical devices and providing accurate position alignment.

2. The array of claim 1, further including solder for attaching the alignment pads of the electrical devices to the at least two electrical connection pads of the multi-chip module.

3. The array of claim 1, wherein the rigid alignment structure comprises a set of pins or a grid-like structure.

4. An array of closely-spaced imaging or display devices comprising:
    a plurality of imaging or display devices, each device including
        top interconnection pads on a front major surface,
        an electrically insulating layer on the front major surface and a rear major surface, and a portion of at least one side surface, with openings in the insulating layer for access to the top interconnection pads,
        patterned metallization on the front and rear major surfaces and over the portion of at least one side surface forming bottom interconnection pads and alignment pads on the rear major surface, the bottom interconnection pads electrically connected to corresponding top interconnection pads by metallization extending over the electrically insulating layer on the portion of the at least one side surface;
    an optically transparent substrate, the devices being positioned front major surface down on the optically transparent substrate; and
    a multilayer interconnect structure overlying the rear major surfaces of the devices in electrical connection with the bottom interconnection pads.

5. The array of claim 4, wherein the optically transparent substrate is rigid.

6. The array of claim 4, wherein the optically transparent substrate comprises a stretched polymer film.

7. The array of claim 4, which further includes a molding material to fix the devices in place.

8. An array of closely-spaced devices comprising:
    a plurality of electrical devices, each electrical device including
        top interconnection pads on a front major surface,
        an electrically insulating layer on the front major surface and a rear major surface, and a portion of at least one side surface, with openings in the insulating layer for access to the top interconnection pads,
        patterned metallization on the front and rear major surfaces and over the portion of at least one side surface forming bottom interconnection pads and alignment pads on the rear major surface, the bottom interconnection pads electrically connected to corresponding top interconnection pads by metallization extending over the electrically insulating layer on the portion of the at least one side surface;
    a substrate comprising a stretched polymer film, the devices being positioned and attached front major surface down on the substrate; and
    a multilayer interconnect structure overlying the rear major surfaces of the devices in electrical connection with the bottom interconnection pads, the substrate and the multilayer interconnect structure being curved to establish an array curvature.

9. A array for a multi-device electronic package including a plurality of devices having major surfaces, with interconnection pads on one of the major surfaces, said array comprising:
    a substrate having a rigid alignment structure thereon projecting from the substrate for mechanical engagement with the devices, the devices being positioned and attached to the substrate with the interconnection pads facing up, whereby the rigid alignment structure provides accurate position alignment; and
    a multilayer interconnect structure overlying the devices and interconnecting selected ones of the interconnection pads.

10. The array of claim 9, wherein the rigid alignment structure formed is a set of pins or a grid-like structure.

* * * * *